(12) United States Patent  (10) Patent No.: US 6,943,401 B1
Fang  (45) Date of Patent: Sep. 13, 2005

(54) FLASH MEMORY CELL WITH DRAIN AND SOURCE FORMED BY DIFFUSION OF A DOPANT FROM A SILICIDE

(75) Inventor: Shenqing Fang, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/661,720

(22) Filed: Sep. 11, 2003

(51) Int. Cl.$^7$ .................................... H01L 29/788
(52) U.S. Cl. ............... 257/315; 257/314; 257/316; 257/320; 257/321; 257/322; 257/326
(58) Field of Search ................ 257/239, 261, 257/298, 315–326; 438/201, 211, 216, 241, 438/257, 258, 260–266, 591, 593

(56) References Cited

U.S. PATENT DOCUMENTS 5,814,854 A * 9/1998 Liu et al. ..................... 257/315
5,960,270 A * 9/1999 Misra et al. ................. 438/197

* cited by examiner

Primary Examiner—Andy Huynh

(57) ABSTRACT

The present invention is a flash memory manufacturing process that facilitates efficient fabrication of a flash memory cell. In one embodiment, a silicide (e.g., CoSi) is utilized as a diffusion source. A layer of silicide is deposited over a source area and drain area. The dopant is implanted into the CoSi and diffuse out conformably along CoSi-Si interface at a relatively low temperature. The low temperature diffusion facilitates fabrication of a Flash core cell with a very shallow source/drain junction, and as a result a robust DIBL. The present invention also facilitates fabrication of memory cells with smaller spacers and shorter gate length.

7 Claims, 6 Drawing Sheets

FLASH MEMORY CELL WITH DRAIN AND SOURCE FORMED BY DIFFUSION OF A DOPANT FROM A SILICIDE

TECHNICAL FIELD

The present claimed invention relates to the field of memory fabrication. More particularly, the present invention relates to a flash memory cell drain and source fabrication system and method that utilizes silicide as a diffusion source.

BACKGROUND ART

Electronic systems and circuits have made a significant contribution towards the advancement of modern society and are utilized in a number of applications to achieve advantageous results. Numerous electronic technologies such as digital computers, calculators, audio devices, video equipment, and telephone systems have facilitated increased productivity and reduced costs in analyzing and communicating data, ideas and trends in most areas of business, science, education and entertainment. Frequently, these advantageous results are realized through the use of information stored on a memory media and manipulated by a processing device. The fabrication of memory devices often involves complex processes that require precise operations to achieve desired delicate balances.

Numerous electronic devices include processors that operate by executing software comprising a series of instructions for manipulating data in the performance of useful tasks. The instructions and associated data are typically stored in a memory at locations identified by a unique indicator or address. The ability to access a memory and transfer information quickly and conveniently usually has a significant impact on information processing latency and often limits the utility a device can provide. The configuration of a memory usually affects the speed at which memory locations are accessed.

Certain types of memories built upon flash memory technologies usually offer the potential for relatively fast information access. Flash memories typically include flash memory cells arranged in a matrix in which each cell is characterized by a voltage operating range. A charge level in a floating gate of the flash memory cell controls whether or not a flash memory cell turns "on" or "off" when a threshold voltage level within the operating range is applied to a gate of the flash memory cell. Flash memory arrays usually offer a number of desirable characteristics. Flash memories are typically non-volatile and can retain information even if power is turned off, allow random access to data and in-system programmability, and have the ability to withstand common shock vibrations and environmental conditions.

Integrated circuit fabrication usually involves multi-step processes that attempt to produce precise components that operate properly. Many integrated circuit processes involve repeated deposition and removal of material layers to fabricate components and it is often very difficult to achieve optimized results within requisite narrow tolerances. The multi-step processes also often include diffusion and implantation operations to create regions with particular electrical characteristics. These regions can be adversely impacted by subsequent process steps in a manner that significantly affects performance. In typical traditional processes, dopants are implanted directly into the silicon (Si), which causes damage in the Si. A high temperature thermal cycle is usually required to anneal out the damage. For example, high temperature annealing can result in diffusion region migration that adversely changes the characteristics of a source or drain junction (e.g., resistivity, drain induced barrier leakage, etc.).

Semiconductor integrated circuit manufacturing efforts are usually complicated by ever increasing demands for greater functionality. More complicated circuits are usually required to satisfy the demand for greater functionality. For example, there is usually a proportional relationship between the number of components included in an integrated circuit and the functionality, integrated circuits with more components typically provide greater functionality. However, including more components within an integrated circuit often requires the components to be densely packed in relatively small areas and reliably packing a lot of components in relatively small areas of an IC is usually very difficult.

One traditional focus for achieving greater densities has been directed towards reducing the size of individual components (e.g., transistors). The components of an integrated circuit are usually fabricated on a single silicon substrate and maintaining both the integrity of the system as a whole as well as the individual basic device characteristics is very important for proper operation. Proper relational characteristics are very helpful in achieving these objectives and without them there is a tendency for detrimental interactions to occur. Thus, it is important for integrated circuit fabrication technologies to provide an advantageous balance between component integrity and increased component density.

Transistor source and drain formation usually include a diffusion process. It is important for source and drain dopants to be accurately applied to ensure proper operation without defects. It is also desirable for the source and drain formation to be efficient and low cost. Diffusion of high quality dopants with the ability to provide shallow junctions can be challenging. Implantation is usually performed before CoSi formation in a typical memory cell formation process. The implantation energy usually has to be high to ensure the CoSi layer is above N+/P junction, which often results in a deeper junction and worse DIBL. Therefore, the ability to precisely form source and drain sections in a convenient and efficient manner is very important.

SUMMARY OF THE INVENTION

The present invention is a flash memory manufacturing process that facilitates efficient fabrication of a flash memory cell. In one embodiment, a silicide (e.g., CoSi) is utilized as a diffusion source. A layer of silicide is deposited over a source area and drain area. The silicide, source area and drain area are implanted with a dopant (e.g., arsenic). The wafer is then subjected to a diffusion process which forces the dopants from the silicide into the source area and drain area. The diffusion process can be performed at relatively low temperatures reducing the probability of region alignment or shift problems. The present invention also enables shallow source and drain junction formation in a manner that facilitates reduced drain induced barrier lowering (DIBL) and reduced source to drain resistance. In addition, utilizing the silicide as a diffusion source enables the use of narrower side wall spacers (e.g., nitride spacers) permitting a greater number of components concentrated in smaller areas.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one ordinarily skilled in the art that the present invention may be practiced without these specific details. In other instances, well known methods, procedures, components, and circuits have not been described in detail as not to unnecessarily obscure aspects of the current invention.

The present invention is a flash memory manufacturing process that facilitates efficient fabrication of a flash memory cell. In one embodiment, a silicide (e.g., CoSi) is utilized as a diffusion source. The present invention provides a shallow core drain junction that permits improved Drain Induced Barrier Lowering (DIBL) and drain to source resistitivity. The present invention also facilitates cell size reduction. For example, the present invention enables reduced nitride spacer thickness on both the source and drain sides of the flash memory cell.

Figure 1:
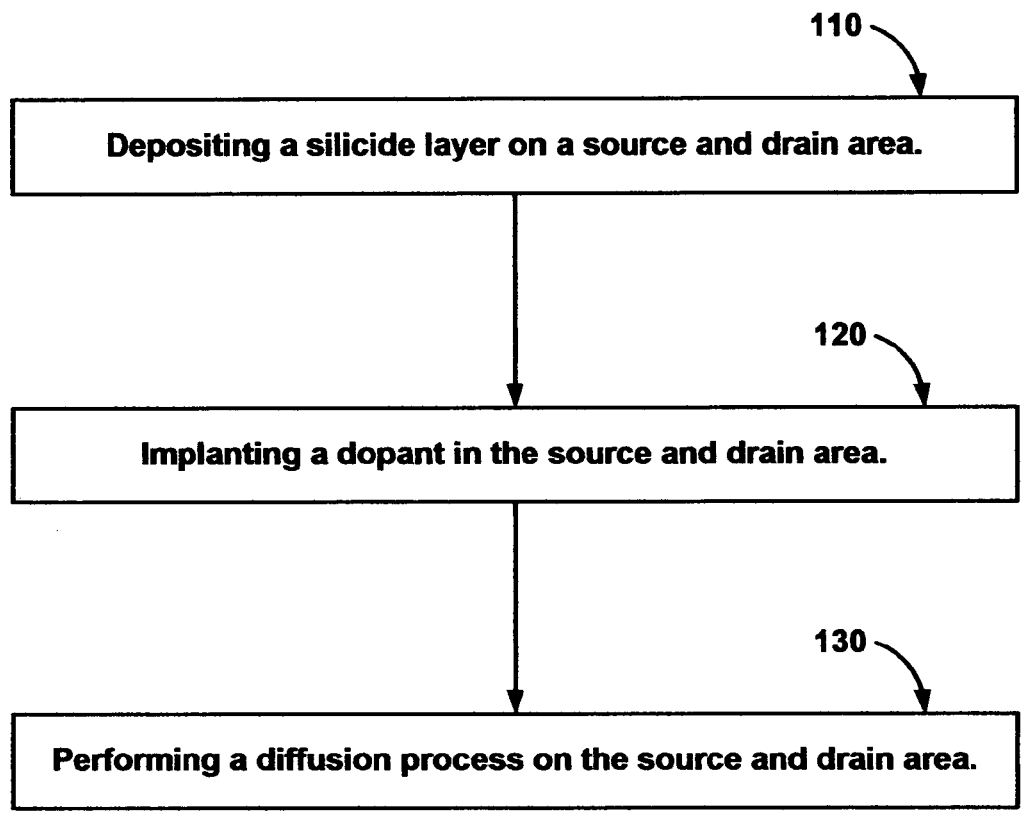
FIG. 1 is a flow chart of a flash memory source and drain formation process in accordance with one embodiment of the present invention.

FIG. 1 is a flow chart of flash memory source and drain formation process 100 in accordance with one embodiment of the present invention. Flash memory source and drain formation process 100 includes utilization of a silicide as a diffusion source. The dopants are implanted in the silicide and then diffused into a wafer substrate. The diffusion can occur at a relatively low temperature greatly reducing thermal budget.

Figure 2A:
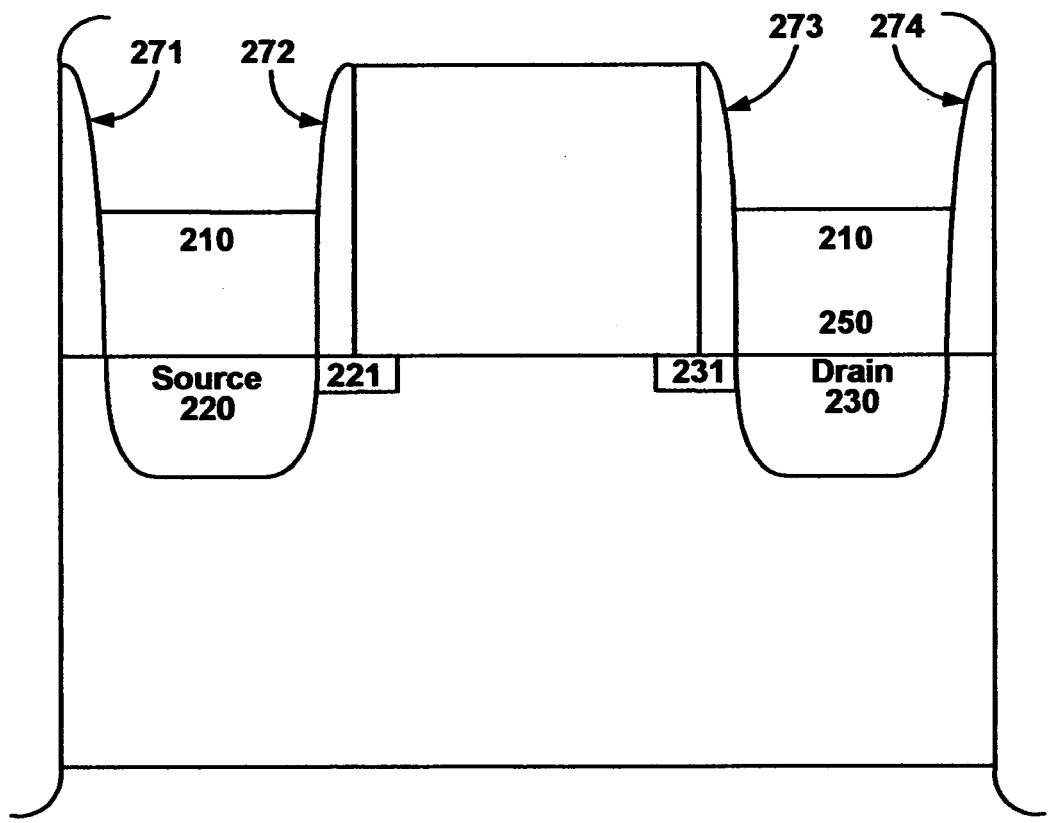
FIG. 2A illustrates one exemplary implementation of a silicide layer deposited on a source area and a drain area in accordance with one embodiment of the present invention.

In step 110 a silicide layer is deposited on a source and drain area. In one embodiment of the present invention, the silicide layer material includes cobalt silicide. FIG. 2A illustrates one exemplary implementation of a silicide layer 210 deposited on source area 220 and drain area 230. The silicide is placed on top of the wafer surface and between side wall spacers 271 and 272 and 273 and 274 respectively.

Figure 2B:
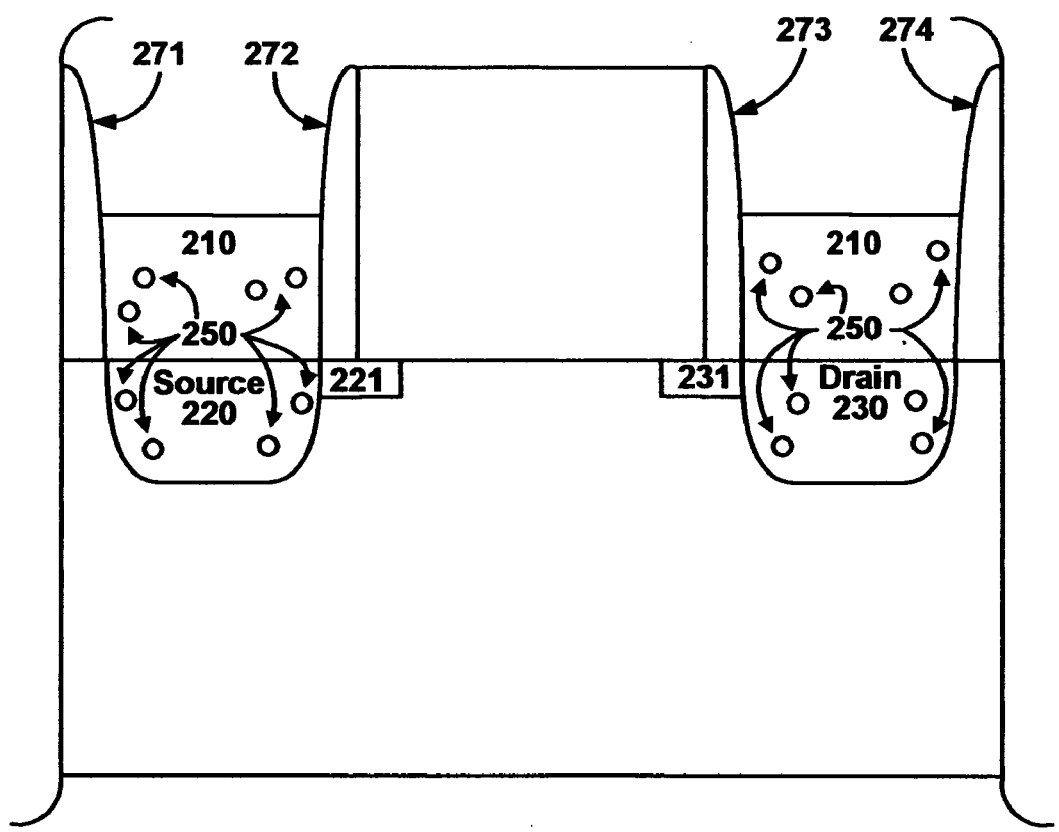
FIG. 2B illustrates one exemplary dopant implantation into a silicide layer, a source area and a drain area of the wafer substrate.

A dopant 250 is implanted in the source area 220 and drain area 230 at step 120. In one embodiment the dopant includes arsenic. In one exemplary implementation, the implanting introduces some of the dopant atoms into the silicide layer. FIG. 2B illustrates one exemplary implantation of dopant 250 (e.g., arsenic, boron, phosphorus, antimony, etc.) into the silicide layer 210, source area 220 and drain are 230 of the wafer substrate. In one example, the dopant provides an electrical charge characteristic to the source and drain areas. Implanting dopant into the CoSi causes minimal or no damage to the silicon. Thus, a present invention Flash core cell process (e.g., flash memory source and drain formation process 100) can use a low temperature anneal (e.g., less than or equal to 900 centigrade) which facilitates fabrication of memory cells with improved DIBL.

Figure 2C:
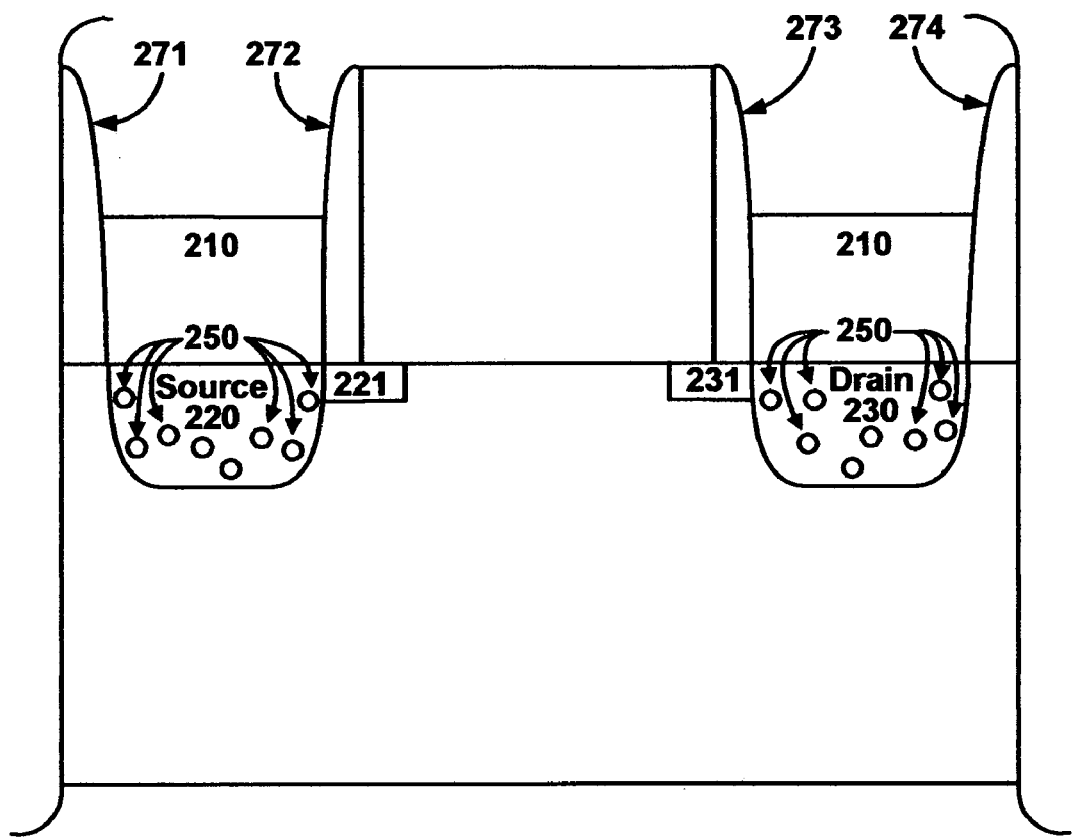
FIG. 2C illustrates one present invention embodiment of diffusing arsenic dopants from a silicide layer into a source area and a drain area of wafer substrate.

In step 130, a diffusion process is performed on the source and drain area. In one embodiment of the present invention, the diffusion process is performed at a relatively low temperature (e.g., between 800 and 900 degrees Celsius). In one exemplary implementation of the present invention, the dopants in the silicide layer diffuse to the source and drain areas during the anneal process. FIG. 2C illustrates one exemplary implementation of diffusing arsenic dopants 250 from the silicide layer 210 into the source area 220 and drain area 230 of the wafer substrate. In one embodiment of the present invention, the dopant implanted (e.g. with a relatively low implantation energy) after CoSi formation diffuses out conformably along the CoSi-Si interface resulting in a shallower junction and a better DIBL. A reduced Source/Drain lateral diffusion is also achieved and helps scaling down spacer thickness (e.g., 272 and 273 in FIG. 2), gate length (e.g., 310 in FIG. 3) and consequently the cell size.

Figure 3:
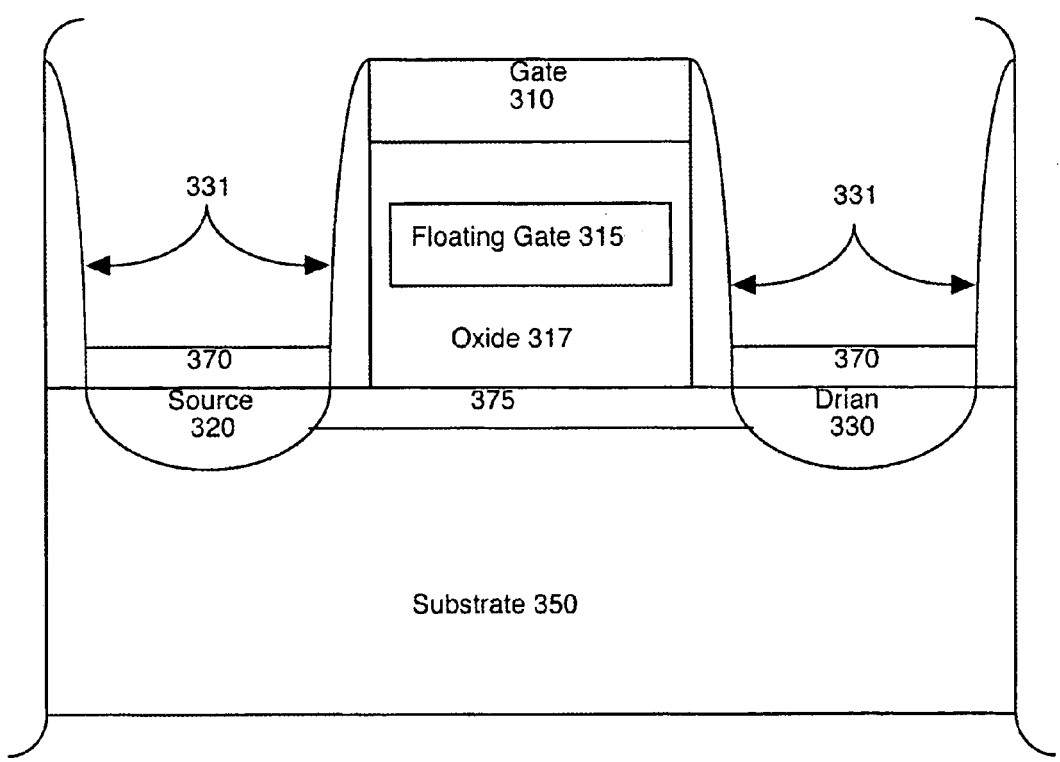
FIG. 3 is a block diagram illustration of a flash memory cell in accordance with one embodiment of the present invention.

FIG. 3 is a block diagram illustration of a flash memory cell 300 in accordance with one embodiment of the present invention. Flash memory cell 300 includes control gate 310, charge storing region 315 (e.g., a floating gate), insulation region 317 (e.g., an oxide region), source 320, drain 330, sidewalls 331, well region 350 (e.g., a substrate) and current conducting channel 375. In one exemplary implementation, a source extension region 221 and drain extension region 231 are formed by very shallow implantation. Source 320 and drain 330 are formed by implantation of a dopant (e.g., arsenic) and diffusion of a dopant from silicide layer 170 (e.g., a cobalt silicide layer). Control gate 310 is coupled to insulation region 317 which is coupled to floating charge trapping region 315 and well region 350. Well region 350 is coupled to source 320 and drain 330. For ease of use and convention, charge storing region 315 and semi-permeable insulating region 317 are referred to as a floating gate and an oxide region respectively, but are not necessarily limited to these implementations.

The components of flash memory cell 300 cooperatively operate to store information. Current conducting channel 375 has doped characteristics of a first charge nature (e.g., positive or negative) and enables current flow depending upon charge levels in control gate 310 and floating gate 315. Well region 350 supplies bulk charges to current conducting channel 375 and thereby facilitates conduction of current in current conducting channel 375. Source 320 includes charge doping characteristics opposite of the first charge nature and supplies current to current conducting channel 375. Drain 330 has charge doping characteristics also opposite of the first charge nature and drains current from current conducting channel 375. Oxide region 317 has insulating characteristics that also act as a barrier to charges entering or leaving floating gate 315 depending upon memory cell voltage levels (e.g., voltage level differential applied to control gate 310 and drain 330). Control gate 310 has a capacity to receive a voltage and collect charge levels that control current flow in current conducting channel 370. Floating gate 315 "traps" or "stores" charges which can impact the "control" (e.g., shift the threshold voltage) of control gate 310 and thereby store information.

Flash memory cell 300 stores information by establishing a charge level (e.g., "write" or "erase" charge level) in the floating gate 315 corresponding to a logical value and sensing the impact on the flow of current in current conducting channel 370 during a read operation. In one exemplary implementation, the status of current flow between the source 320 and the drain 330 in a read condition is utilized to establish storage of a logical 1 value or a logical 0 value. For example, a logical 1 can be assigned to an indication of a current flow between source 320 and drain 330 and a logical 0 can be assigned to an indication of no current flow between source 320 and drain 330, or vise versa. Since the charge level state in the floating gate 315 can impact the current flow in current conduction channel 317, there is a correlation between a logical 1 value or a logical 0 value and the charge in floating gate 315. The charge level of the floating gate determines the flash memory cell state by shifting the threshold voltage. An erased state occurs when a first charge level in the floating gate does not significantly impact (e.g., no appreciable shift in the threshold voltage) the memory cell's turn-on/off threshold voltage. A written state occurs when a second charge level does significantly impact the memory cell's turn-on/off threshold voltage (e.g., there is an appreciable shift in threshold voltage).

Figure 4:
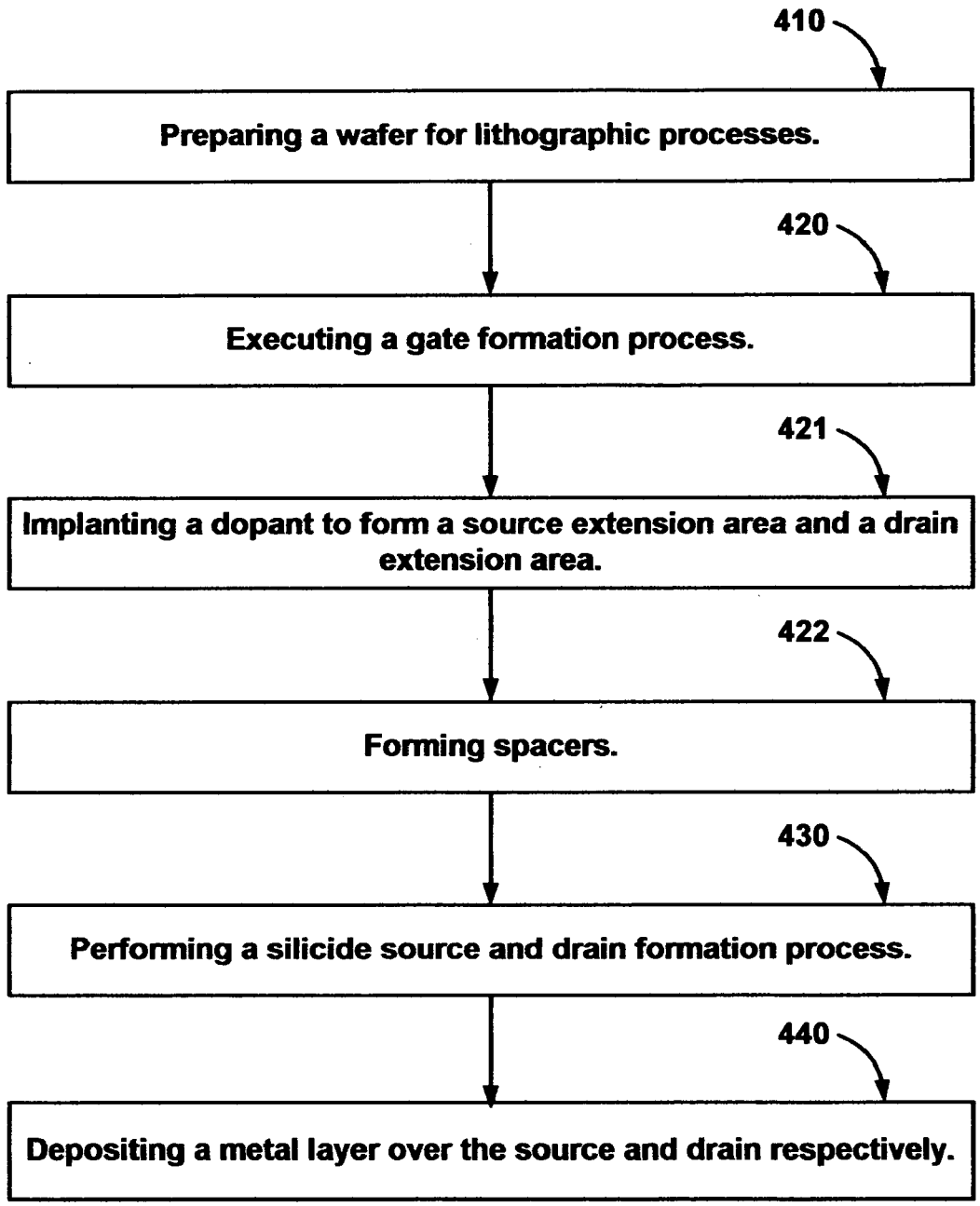
FIG. 4 is a flow chart of one embodiment of a present invention flash memory formation method.

FIG. 4 is a flow chart of flash memory formation method 400, one embodiment of a flash memory formation method in accordance with the present invention. Flash memory formation method 400 includes a silicide layer over the source and drain areas that facilitates diffusion of dopants into the source and drain areas. This diffusion process provides shallow junction formation with reduced resistivity. In addition, utilizing the silicide as a diffusion source enables the use of narrower side wall spacers (e.g., 50 Å to 800 Å thick).

In step 410, a wafer substrate is prepared for lithographic processes. In one embodiment of the present invention, the wafer surface is made smooth and level, for example by chemical mechanical polishing (CMP). A protective layer of oxide and a subsequent layer of nitride are desposited on the surface. In one exemplary implementation, additional polishing is performed to provide a smooth and level surface after the protective oxide and nitride layers are added.

A gate formation process is executed at step 420. In one embodiment of the present invention, an insulating layer (e.g., oxide) is deposited. A floating gate area is created in the insulating layer. For example, a floating gate area is etched in the insulating layer and a charge trapping material (e.g., a polysilicide) is deposited in the floating gate area. Excess charge trapping material is removed and additional insulating material deposited. A control gate material (e.g., silicide, metal, etc.) is deposited on top of the insulating material. The materials deposited during the gate formation process are removed (e.g, etched) from areas not included in the gate (e.g., areas above a source and drain). In one exemplary implementation, a sidewall spacer material is deposited on the sides of the gate area and excess sidewall spacer material is removed.

Flash memory formation method 400 includes a source and drain extension implant step and spacer formation step in one embodiment of the present invention. In one exemplary implementation, a dopant is implanted in step 421 to form a source extension area and a drain extension area (e.g., source extension area 221 and a drain extension area 231). Spacers are formed in step 422. The spacers (e.g, spacers 272 and 273) are relatively narrow and permit greater component density.

In step 430, a silicide source and drain formation process is performed. The source and drain area are prepared for implantation and diffusion. For example, excess material from the gate formation process and the protective layer materials over the source and drain areas are removed. A silicide layer (e.g., CoSi) is deposited on the source and drain area and a dopant (e.g. arsenic) is implanted in the source and drain area. In one exemplary implementation, some of the dopant is trapped in the silicide layer during the implantation of dopants in the source and drain areas. A diffusion process is performed on the source and drain area to "push" doping agents included in the silicide layer through the surface of the wafer substrate into the source and drain areas.

In step 440, a metal layer is deposited over the source and drain areas respectively. In one embodiment of the present invention, a plurality of metal layers are deposited and each of the respective metal layers are separated by insulating layers. The metal layers couple the source and drain to other components included on the wafer.

Thus, the present invention facilitates precise formation of source and drain sections in a convenient and efficient manner. Utilization of a silicide implanted with dopants as a diffusion source enables the diffusion to occur at a relatively low temperature reducing annealing problems. This diffusion process provides shallow drain and source junction formation which improves the drain induced voltage leakage characteristics of the cell. The shallow junctions also enable reductions in source to drain resistance. In addition, utilizing the silicide as a diffusion source enables the use of narrower side wall spacers (e.g., nitride spacers) permitting a greater number of component concentrated in smaller areas.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A memory cell comprising:
    a control gate component having a capacity to receive a charge;
    an oxide region having electrical charge insulation characteristics and electrical charge penetration characteristics, said oxide region coupled to said control gate;

a floating gate having a charge trapping region, said floating gate coupled to said oxide region;

a well component having a charge doping characteristic, said well coupled to said floating gate component;

a source component having opposite charge doping characteristics formed by implantation of a dopant and diffusion of said dopant from a silicide in a source metal contact region, said source component coupled to said well component; and a drain component having similar doping charge characteristics to said source component and formed by implantation of a dopant and diffusion of said dopant from said silicide in a drain metal contact region, said drain component coupled to said well component.

2. The memory cell of claim 1 wherein said source and drain form shallow junctions.

3. The memory cell of claim 1 wherein some of said dopant is trapped in said silicide layer during an implantation of dopants in said source and drain areas.

4. The memory cell of claim 1 wherein said diffusion is performed in a temperature range of about 600 to 800 Celsius.

5. The memory cell of claim 1 wherein said silicide includes cobalt silicide.

6. The memory cell of claim 1 wherein said dopant includes arsenic.

7. The memory cell of claim 1 further comprising sidewall spacers that have a thickness of about 50 Å to about 800 Å, wherein said silicide is deposited between a pair of said sidewall spacers.

\* \* \* \* \*